United States Patent [19]

Clifton et al.

[11] Patent Number: 5,162,610
[45] Date of Patent: Nov. 10, 1992

[54] SHIELDED ENCLOSURE FOR AN ELECTRONIC DEVICE

[75] Inventors: Frank Clifton; John M. Berner; Frank W. Campbell; Allan J. Alden, all of Minneapolis, Minn.

[73] Assignee: Control Systems, Inc., St. Paul, Minn.

[21] Appl. No.: 496,989

[22] Filed: Mar. 21, 1990

[51] Int. Cl.⁵ .............................................. H05K 9/00
[52] U.S. Cl. .................. 174/35 R; 312/223; 361/424
[58] Field of Search ............ 211/41; 312/223; 174/35 R, 35 GC; 334/85; 200/303, 304, 305; 455/300; 361/212, 220, 334, 380, 395, 399, 424

[56] References Cited

U.S. PATENT DOCUMENTS

| | | | |
|---|---|---|---|
| 4,777,565 | 10/1988 | McIntosh | 361/424 |
| 4,855,873 | 8/1989 | Bhargava | 361/424 |
| 4,904,879 | 2/1990 | Rudy, Jr. | 307/17 |
| 4,916,578 | 4/1990 | Mast | 361/424 |
| 4,926,291 | 5/1990 | Sarraf | 361/384 |
| 5,004,866 | 4/1991 | Cooke | 174/35 GC |
| 5,014,160 | 5/1991 | McCoy, Jr. | 361/424 |

FOREIGN PATENT DOCUMENTS

| | | | |
|---|---|---|---|
| 2156162 | 10/1985 | United Kingdom | 361/424 |
| 2723359 | 4/1990 | United Kingdom | 361/424 |

Primary Examiner—Gerald P. Tolin
Attorney, Agent, or Firm—James D. Hall

[57] ABSTRACT

A shielded housing for a computer or the like including top and bottom housing parts. The top housing part includes a top wall and two side walls. The bottom housing part includes bottom, front and back walls. An inverted V-shaped channel is carried by the side walls adjacent the lower edges for a cooperating fit between the channels and upturned flanges carried by the bottom wall planar surface. The inner surfaces of the housing parts include shielding for reduction of electrostatic noise from the enclosure. The cooperating fit between the channels and bottom wall flanges provide and improved side wall junction to prevent electrostatic noise from leaking along the side wall edges.

4 Claims, 2 Drawing Sheets

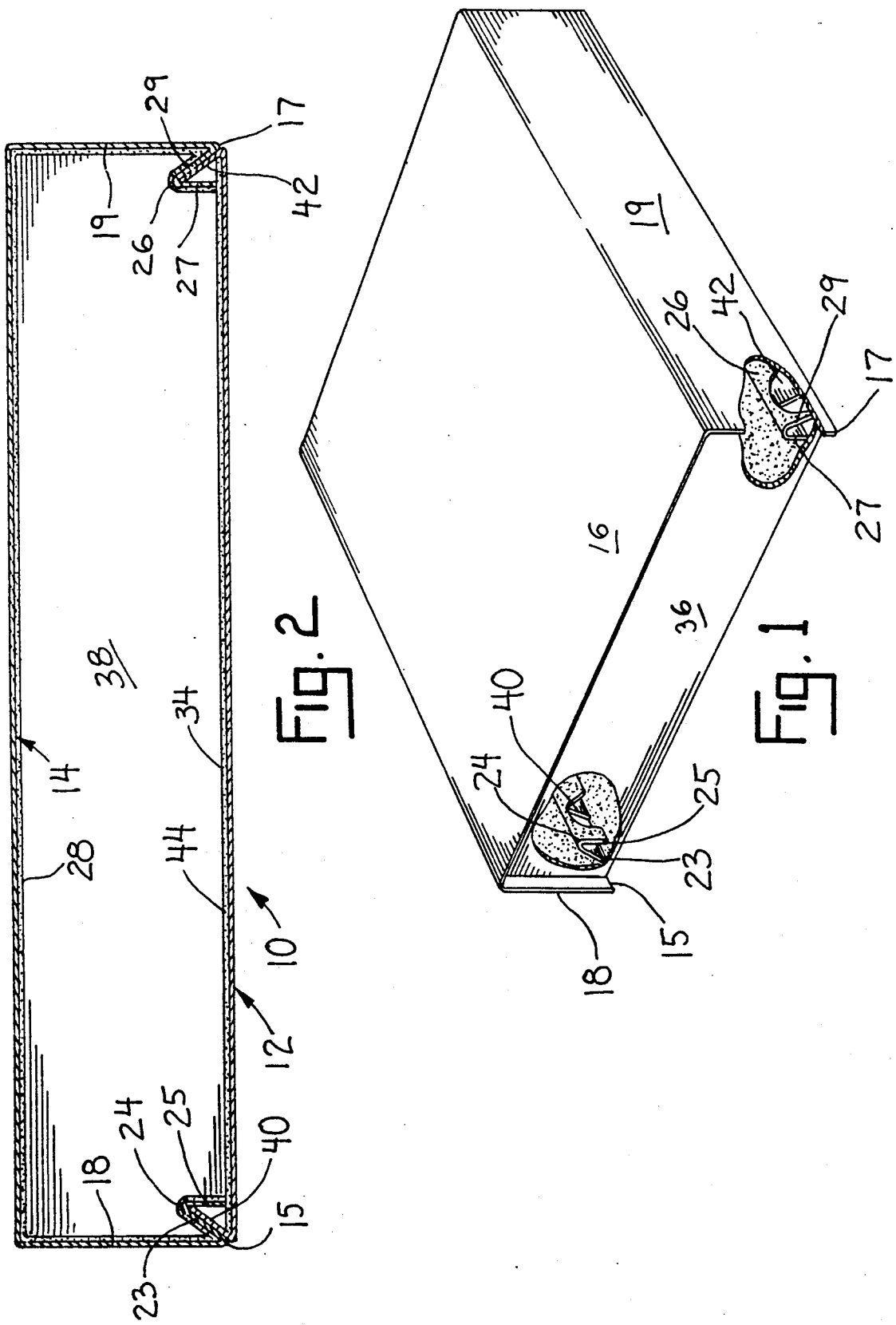

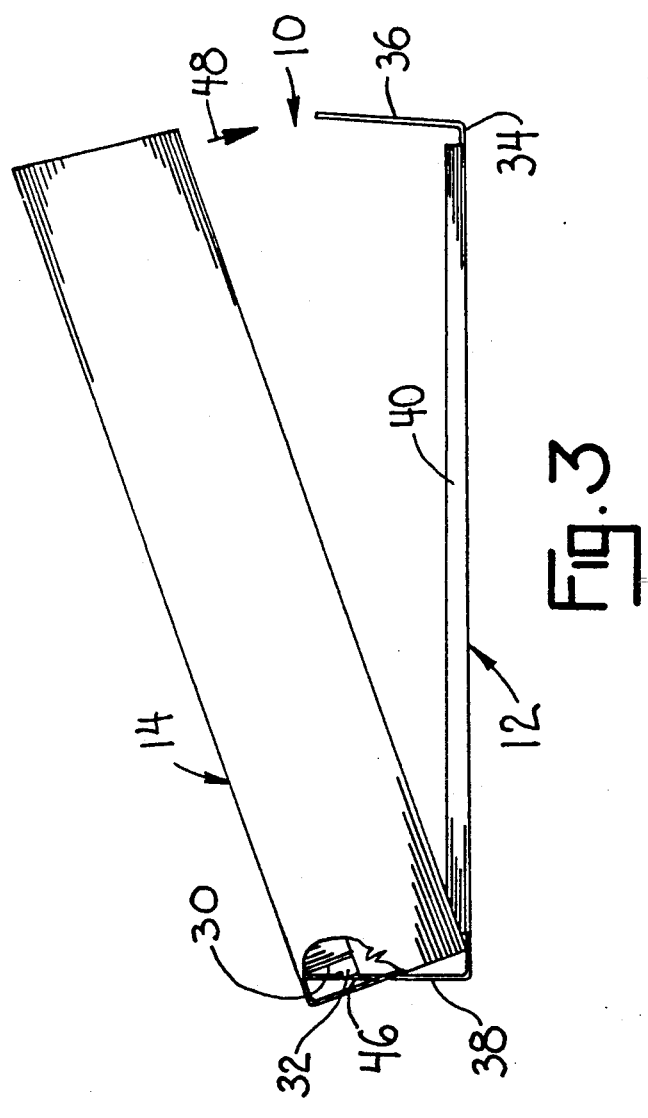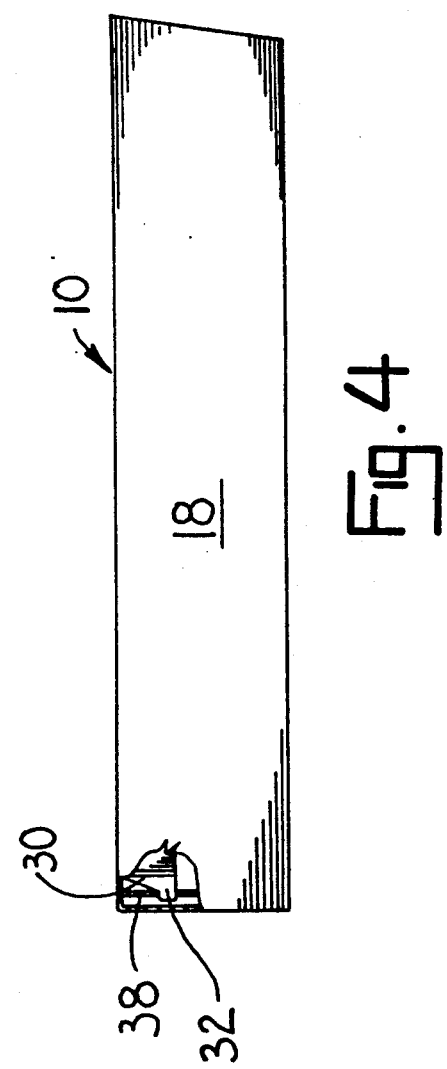

SHIELDED ENCLOSURE FOR AN ELECTRONIC DEVICE

FIELD OF THE INVENTION

This invention relates to an electronic enclosure and has specific relevance to a shielded electronic enclosure.

BACKGROUND OF THE INVENTION

It is common for electronic devices such as computers, computer peripherals or other equipment operating at high frequencies to generate high frequency noise. Such noise can interfere with other equipment in the surrounding area. To prevent this interference, the electronic housings are commonly lined with conductive shielding material which is electrically connected to ground. The high frequency noise (in the form of radio waves) generated by the electronic device is picked up by the conductive shield material and shunted to ground before the waves are able to escape the housing. The maximum noise allowed to escape from the enclosure is closely monitored and regulated by governing bodies such as the FCC.

Heretofore, shielded electronic housings typically include a top part having two side walls and a top wall and a bottom part having a bottom wall and front and back walls. Typically, the top and bottom parts bluntly abut one another at their edges. A problem associated with this type of enclosure is that the abutting edges between the side walls and bottom wall often allow the high frequency waves to escape.

SUMMARY OF THE INVENTION

The shielded electrical housing of this invention eliminates the problems experienced above by providing inclined overlapping edges at the junction between the bottom wall and side walls. The overlapping edge is formed by an inverted V-shaped channel which extends inwardly from each side wall lower edge and an elongated flange extends upwardly from the bottom wall at an acute angle. The channels and flanges extend for a substantial distance along the lower side wall edges and bottom side edges. Each flange is accommodated between the legs of the mating V-shaped channel. The interior of the upper housing part including the top side wall and channel is coated with a shielding material. The bottom wall is likewise coated with the shielding material. The inner leg of the V-shaped channel is generally parallel to its side wall and abuts the bottom wall shielding to produce a noise tight seal at the lower side edges of the box.

Accordingly, it is an object of this invention to provide for a novel shielded electronic enclosure.

Another object of the invention is to provide for an electronic enclosure having lower side edges which prevent high frequency noise from escaping.

Other objects will become apparent upon a reading of the following description taken with the accompanying drawings.

BRIEF DESCRIPTION OF THE DRAWINGS

FIG. 1 is a perspective view of the shielded electronic enclosure of the invention with portions cut away for illustrative purposes.

FIG. 2 is a cross sectional view of the enclosure of this invention.

FIG. 3 is a side elevational view of the invention in the open position with portions cut away for illustrative purposes.

FIG. 4 is the elevational view of FIG. 3 with the enclosure closed.

DESCRIPTION OF THE PREFERRED EMBODIMENT

The preferred embodiment herein disclosed is not intended to be exhaustive or to limit the application to the precise form disclosed. Rather, it is chosen and described to enable others skilled in the art to utilize its teachings.

As illustrated in the figures, housing 10 includes a bottom shell 12 and a top shield 14. Top shell 14 in cross section is generally C-shaped and includes a top wall 16 and side walls 18, 19 which extend from top wall 16 and terminate in lower edges 15, 17. A longitudinal inverted V-shaped channel 24 is carried by side wall 18 along lower edge 15. Channel 24 is extends a substantial distance along side wall 18 and includes an inner leg 25 and an outer leg 23. Inner leg 25 of channel 24 is generally parallel with side wall 18. Similarly, a longitudinal inverted V-shaped channel 26 is carried by side wall 19 adjacent lower edge 17. Channel 26 extends along a substantial portion of side wall 19 and includes an inner leg 27 and an outer leg 29. Inner leg 27 of channel 26 is generally parallel to side wall 19. In the preferred embodiment illustrated top wall 16, side walls 18, 19 and channels 24, 26 are integral components. A layer of electrically conductive shielding 28 is applied to the inner surface of top shell 16 in a manner consistent with common practices. Shielding 28 may be sprayed onto the interior surfaces or consist primarily of a metal impregnated paper product. In either instance, it should be understood that as is illustrated, shielding 28 should cover the entire inner surface of top shell 14. As illustrated in FIGS. 3 and 4 top shell 14 further includes a pair of aligning posts 30 (only one shown) which are connected to the side walls adjacent back edge 22 of shell 14. Each post 30 includes a tab 32 which extends rearwardly. Posts 30 are shaped such that tabs 32 are inset relative to side walls 18, 19.

Bottom shell 12 includes a bottom wall 34 with front wall 36 and back wall 38 extending upwardly therefrom. A longitudinal flange 40 extends at an acute angle from one side edge of bottom wall 34 and a flange 42 extends at an acute angle from the other bottom wall side edge. Flanges 40, 42 extend along a substantial portion of the bottom walls side edges. In the preferred embodiment bottom wall 34, front wall 36, back wall 38 and flanges 40, 42 are integral components. A layer of electrically conductive shielding 44 is applied to the upper surface of bottom wall 34 between flanges 40, 42 and front wall 36 and back wall 38. Again, shielding 44 may be applied in any manner consistent with the industry. A pair of slot openings 46 (only one shown) are formed through back wall 38 in alignment with tabs 32 of alignment posts 30 (only one shown).

In use with top shell 14 initially separate from bottom shell 12, tabs 32 are inserted into slots 46 as illustrated in FIG. 3. The top shell 16 is then pivoted in the direction of arrow 48 until the top shell is in the closed position of FIGS. 1, 2 and 4. So positioned it can be seen in FIG. 2 that flanges 40, 42 are accommodated by V-shaped channels 24, 26 respectively. As illustrated best in FIG. 2 the outer legs 23, 29 of channels 24, 26 abut the outer surface of flanges 40, 42 respectively. Inner legs 25, 27 of channels 24, 26 abut shielding 44 on bottom wall 34. Therefore given the overlapping relationship between the channels and the flanges as well as the contact between the inner legs and bottom a noise proof seal is formed between the side walls and the bottom edge.

It should be understood that although not illustrated enclosure 10 would in practice include openings consistent with common practice for accommodating switches, lights cable connects, as is common in the industry. Further, that it may be desirous to latch the top and bottom shells together. Finally it should be further understood that the invention is not to be limited by the details above but may be modified within the scope of the appended claims.

We claim:

1. An enclosure for carrying an electronic device, said enclosure including an upper housing part and a lower housing part, said upper housing part including a top wall and a pair of side walls extending from opposite side edges of said top wall and defining an inner surface, said lower housing part including a bottom planar surface and a back wall extending upwardly from said bottom planar surface, an inturned flange member extending longitudinally along a side edge of said bottom planar surface, channel means being carried by one of said upper housing part side walls extending longitudinally along a lower edge of said side wall and fitting with said lower housing part flange member, said channel means including a leg in abutting contact with said bottom planar surface, and conductive shielding covering said upper housing part inner surface said bottom planar surface, wherein said abutting contact between said channel leg and said bottom planar surface constitutes means for preventing electric radio wave noise from escaping from said enclosure at the junction of said channel leg and said bottom planar surface.

2. The enclosure of claim 1 wherein said channel means is an inverted V-shape and includes a second leg diagonally extending from said first leg to said upper housing part side wall lower edge, said second leg being generally parallel with and overlying said lower housing part flange member.

3. The enclosure of claim 1 wherein said top wall constitutes means connected to said back wall for pivotally moving said top wall.

4. The enclosure of claim 3 wherein said means for pivotally moving said top wall includes a post connected to said side wall, said post including a tab extending rearwardly, said tab being inserted through a slot formed through said back wall.

* * * * *